Sept. 24, 1968 YOSHIO MATSUNAGA 3,403,150
POLYCYCLIC AROMATIC HALOGEN COMPLEXES AS ORGANIC SEMICONDUCTORS
Filed June 21, 1967
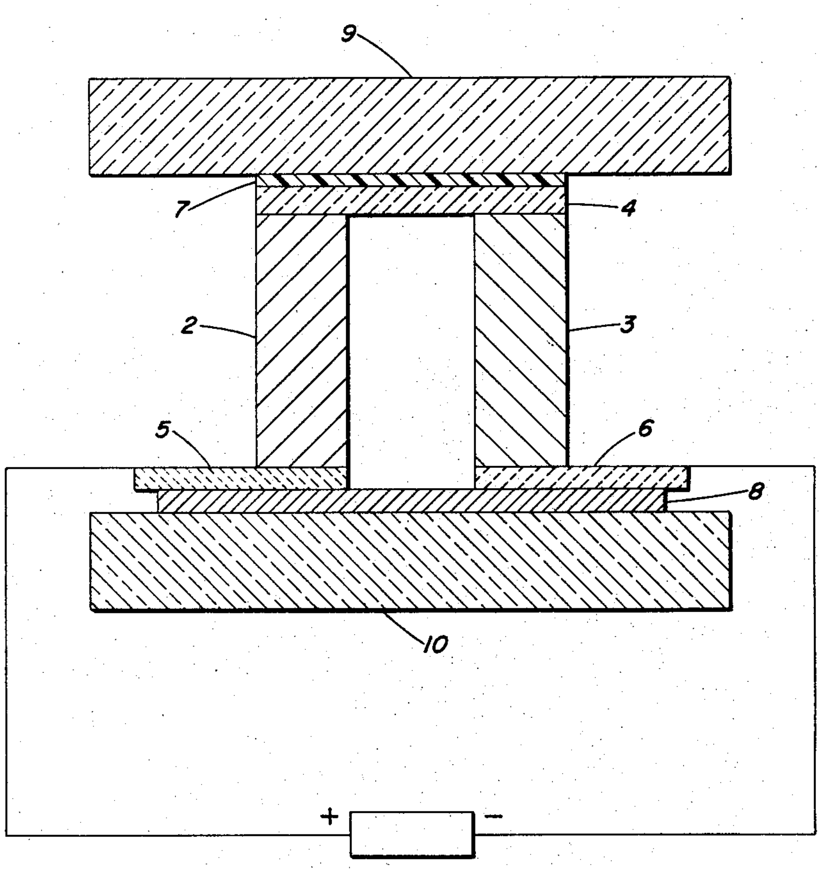
INVENTOR.
YOSHIO MATSUNAGA
BY John E. Hanrahan
ATTORNEY United States Patent Office 3,403,150

Patented Sept. 24, 1968

3,403,150

POLYCYCLIC AROMATIC HALOGEN COMPLEXES AS ORGANIC SEMICONDUCTORS

Yoshio Matsunaga, Sapporo, Japan, assignor to American Cyanamid Company, Stamford, Conn., a corporation of Maine Continuation-in-part of application Ser. No. 264,924, Mar. 13, 1963. This application June 21, 1967, Ser. No. 647,653

3 Claims. (Cl. 260—243)

ABSTRACT OF THE DISCLOSURE

Invention relates to novel polycyclic aromatic halogen complexes and in particular thiazine-iodine complexes such as N-methylphenothiazine-iodine complexes. The aforesaid complexes are useful as organic semiconductors.

This application is a continuation-in-part of application Ser. No. 264,924 filed Mar. 13, 1963, now abandoned.

This invention relates to new semiconducting compounds and their use in solid state semiconductor devices. More particularly, this invention relates to novel polycyclic aromatic halogen complexes and to the use of such complexes in solid state semiconductor devices.

Solid state semiconductor devices are in general well known and are characterized by a body of an electrically conducting substance which is subjected to electrical or magnetic fields, to corpuscular or wave radiation, or to a plurality of such phenomena for producing electrical, photoelectrical, optical or other physical effects. Typically, such devices include transistors, thermistors, rectifiers, diodes, photocells, photoconductors, radiation detectors, thermocouples, thermoelectric generators, and Peltier cooling cells, among others.

There are today but a limited number of known organic semiconducting materials and even fewer such materials which may be characterized as having simple molecular structure which exhibit resistivities of less than 100 ohm centimeters. It will be appreciated that a resistivity of less than 100 ohm centimeters at room temperature would, as a practical matter, greatly increase the application areas where an organic semiconductor might be utilized.

Accordingly, it is an object of the present invention to provide a limited class of novel polycyclic aromatic halogen complexes of comparatively simple molecular structure characterized by resistivities of less than 100 ohm centimeters at room temperature.

It is a further object of this invention to provide solid state semiconductor devices employing the novel polycyclic organic complexes referred to above and in particular thermoelectric devices.

These and other objects and advantages of the present invention will become more apparent from the detailed description thereof set forth hereinbelow in conjunction with the accompanying drawing, the single figure of which is in plan view and demonstrates the use of the organic semiconductors of this invention in a thermoelectric device.

According to the present invention, a semiconductor device is provided comprising an organic semiconductor and circuit means electrically connected therewith in which the semiconductor comprises a solid complex of the formula:

(I)

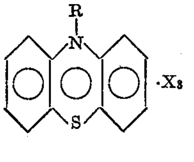

where X is selected from the group consisting of iodine, bromine, chlorine and mixtures thereof, and R is lower alkyl, i.e., methyl, ethyl, propyl and butyl.

Preferably, the thiazine-halogen complex is a thiazine-iodine complex and specific compounds include N-methylphenothiazine, N-ethylphenothiazine and N-propylphenothiazine.

The composition of the product complexes are denoted here as the ratio of the number of molecules of electron donor to electron acceptor. For example, a complex of the composition (I) above represents a product formed by reaction of two molecules of the thiazine with three iodine ($I_2$) molecules and thus is referred to as a 2:3 complex.

The thiazine-halogen complexes are prepared by mixing of solutions of the components, i.e., the thiazone and the halogen, or by the addition of the halogen to the thiazine dissolved in benzene. To obtain the 2:3 complexes to which this invention is principally directed, a suitable amount of iodine should be left in the solution. The precipitate is then filtered and dried at water bath temperatures. For analysis a known amount of the complex is dissolved in a large amount of benzene and the iodine content is determined by titration against sodium thiosulfate.

The N-methylphenothiazine-iodine 2:3 complex may be precipitated or crystallized from solutions containing the components in a mole ratio of 2:3 in ether. This complex can be made also by fusion of a mixture of calculated amounts of the components.

Example 1

3.8 grams of iodine dissolved in 100 ml. of warm ether were added to 2.3 grams of N-ethylphenothiazine dissolved in 100 mls. of cold ether. The complex precipitated as small dark green needles. The yield was 2.5 grams.

Example 2

1.9 grams of iodine in 50 ml. of warm ether were added to 1.2 grams of N-n-propylphenothiazine dissolved in 25 ml. of cold ether. The complex appeared as small dark green needles. The yield was 1.9 grams.

The iodine content, determined by iodometric titration of illustrative 2:3 complexes, is as follows:

| Thiazine-iodine complex donor | Percent iodine | |
|---|---|---|
| | Calculated | Observed |
| N-methylphenothiazine | 64.2 | 65.3 . 66.4 |
| N-ethylphenothiazine | 62.6 | 65.3 |
| N-n-propylphenothiazine | 61.2 | 65.5 |

The resistivity of pressed samples of the thiazine-iodine complexes was measured by a standard four probe technique. It was determined that the resistivity in all cases obeyed the usual relation for the temperature dependence of resistivity of semiconductors:

$$\rho=\rho_0 exp(E/kT)$$

in which $\rho$ is specific resistivity, $\rho_0$ is pre-experimental factor, E is activation energy, $k$ is Boltzmann constant and T is absolute temperature.

The pressed samples were polycrystalline specimens subjected to a pressure of 150 kg./cm.$^2$ in a press. The samples had a diameter of about 8.5 mm.

The resistivity measurements for the N-methylphenothiazine-iodine complexes were carried out at a temperature range of from 3 to 39° C.

The resistivity values ($\rho$) at 20° C. and the values of E and $\rho_0$ are as follows:

| | $\rho$(20°) | E | $\rho_0$ |
|---|---|---|---|
| 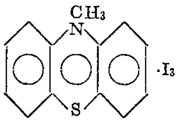 | 1.4Ωcm | 0.14eV | 0.005Ωcm |
| 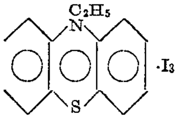 | 10.2Ωcm | | |
| 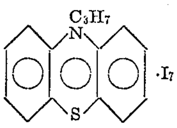 | 15.1Ωcm | | |

It will be noted that the N-methylphenothiazineiodine complex has the lowest resistivity ever found with halogen complexes and is a halogen complex from which large crystals may be grown.

The N-alkylphenothiazine-iodine complexes of this invention have markedly lower electrical resistivities when compared with phenothiazine. Thus a phenothiazine-iodine complex donor having a calculated iodine content of 65.7% and an observed content of 64.5% and 65.7% was determined to have a resistivity value ($\rho$) at 20° C. of 20Ω cm., an E value of 0.17 ev. and a $\rho$ value of 0.04Ω cm.

Since the electric properties of these thiazine-iodine complexes may be affected by departure from exact stoichiometric conditions, raw materials of high purity should be employed. Influencing of the electric properties may be achieved deliberately by the inclusion of various impurities or dopes. It is known that semiconductors which have successive zones of different electrical properties are of particular significance for various practical applications. For instance, a semiconductor crystal which in one zone is an excess electron (n-type) conductor and in the adjacent zone a defect-electron conductor (hole conductor, p-type) is in general suited as a rectifier. Further, a semiconductor having an excess electron conductance or n-type zone followed by a defect-electron conductance or p-type zone and again followed by a n-type zone is useful as a controllable resistor. In this respect, reference may be made to those devices that have become known as transistors.

In employing the new semiconductors, as for example in photoconductive devices, thermoelectric generators, and the like, the thiazine-iodine complexes are introduced into the device connected to circuit means electrically connected therewith.

Illustratively, in a thermoelectric device, as for refrigeration by the Peltier effect, it is desired to utilize semiconductor materials of the highest possible electrical conductivity, the highest possible Seebeck coefficient, and the lowest possible thermal conductivity, so as to maximize the expression $$Z=\frac{S^2\sigma}{K}$$

where S is Seebeck coefficient, $\sigma$ is electrical conductivity, K is thermal conductivity and Z is the thermoelectric figure of merit, well known in the art to be the essential design parameter whose value is desired to be as large as possible.

In order to produce a thermoelectric device, both n- and p-type semiconductor materials are most desirably employed in combination, electrically and are thermally connected.

To illustrate a use of these novel complexes, reference should be had to the accompanying drawing, in which an n-type semiconductor 2 and a p-type semiconductor 3 are connected electrically by an electrical conductor connector 4. Electrical conductors 5 and 6 are attached to semiconductors 2 and 3, respectively, and to the positive and negative electrodes of a DC power source. Thermally conductive electrical insulator 7 is in contact with electrical conductor 4 and cold junction 9 while thermally conductive electrical insulator 8 is in contact with electrical conductors 5 and 6 and hot junction 10. When DC electrical power of the proper polarity is applied to the conductors 5 and 6, heat will be withdrawn from the body 9 and transferred to the body 10. A number of such thermoelectric heat pumping elements may be connected together in series or parallel manner so as to provide heat pumping capacities for refrigerating devices capable of cooling small parts, such as power transistors, or large freezing units, such as domestic food freezers.

I claim:

1. A compound of the formula:

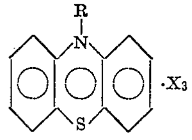

where X is selected from the group consisting of iodine, bromine, chlorine and mixtures thereof and R is lower alkyl.

2. A compound according to claim 1 in which X is iodine and R is methyl.

3. A compound according to claim 1 in which X is iodine.

References Cited

UNITED STATES PATENTS 3,117,123 1/1964 Strycker ------------ 260—243

HENRY R. JILES, *Primary Examiner.*

H. I. MOATZ, *Assistant Examiner.*

PATENT OFFICE

Washington, D.C. 20231

UNITED STATES PATENT OFFICE

CERTIFICATE OF CORRECTION

Patent No. 3,403,150 September 24, 1968

Yoshio Matsunaga

It is certified that error appears in the above identified patent and that said Letters Patent are hereby corrected as shown below:

Column 3, opposite third formula, ".$I_7$" should read -- .$I_3$ --.

Signed and sealed this 10th day of March 1970.

(SEAL)

Attest:

Edward M. Fletcher, Jr.

Attesting Officer

WILLIAM E. SCHUYLER, JR.

Commissioner of Patents

[redacted]